United States Patent [19]

Narui et al.

[11] Patent Number: 5,438,583
[45] Date of Patent: Aug. 1, 1995

[54] SEMICONDUCTOR LASER WITH OPTIMUM RESONATOR

[75] Inventors: Hironobu Narui; Masato Doi; Kenji Sahara; Osamu Matsuda, all of Kanagawa, Japan

[73] Assignee: Sony Corporation, Tokyo, Japan

[21] Appl. No.: 166,949

[22] Filed: Dec. 15, 1993

[30] Foreign Application Priority Data

Dec. 15, 1992 [JP] Japan .................................. 4-334681
Jul. 19, 1993 [JP] Japan .................................. 5-177978

[51] Int. Cl.$^6$ ............................................. H01S 3/19
[52] U.S. Cl. ......................................... 372/45; 372/46
[58] Field of Search ............................. 372/44, 45, 46

[56] References Cited

U.S. PATENT DOCUMENTS 4,603,420 7/1986 Nishizawa et al. .................... 372/45

OTHER PUBLICATIONS

*Database Inspec Institute of Electrical Engineers,* H. Takiguchi et al., "Noise Reduction in Injection Lasers by Superposition of the Low Frequency Pulse", No. 30, Jan. 1984, pp. 41–46.

*Electronics Letters,* T. Saiton et al., "Broadband 1.5 mum GaInAsP Travelling-wave Laser Amplifier with High Saturation Output Power", vol. 23, No. 5, 26 Feb. 1987, pp. 218–219.

*IEEE Journal of Quantum Electronics,* H. Narui et al., "A Submilliampere Threshold Multiquantum Well AlGaAs Laser without Facet Coating Using a Single Step", vol. 28, No. 1, Jan. 1992, pp. 4–8.

*Applied Physics Letters,* 1. a. Koszi et al., "High Power Operation of InP/InGaAsP DCPBH Lasers with Asymmetric Facet Coatings", vol. 51, No. 26, Dec. 1987, pp. 2219–2221.

*Applied Optics,* A. Arimoto et al., "Diode Laser Noise at Control Frequencies in Optical Videodisc Players", vol. 23, No. 17, Sep. 1984, p. 2919, para. V.

*Applied Physics Letters,* "Suppression of Feedback-Induced Noise in Short Cavity V-Channeled Substrate Inner Stripe Lasers with Self Oscillation", vol. 43, No. 3, Aug. 1983, pp. 219–221.

*IEEE Journal of Quantum Electronics,* M. Kume et al., "A New Monolithic Dual GaAlAs Laser Array for Read/Write Optical Disk Applications", vol. QE–23, No. 6, Jun. 1987, pp. 898–902.

*Primary Examiner*—Rodney B. Bovernick
*Assistant Examiner*—Robrt E. Wise
*Attorney, Agent, or Firm*—Hill, Steadman & Simpson

[57] ABSTRACT

A semiconductor laser and an optical device employing the semiconductor laser are described. The semiconductor laser comprises and activating layer; first and second cladding layers for sandwiching the activating layer, the energy gaps of which are greater than that of the activating layer; a current blocking layer provided in contact with both sides of the activating layer; a first electrode electrically connected to the first cladding layer; and a second electrode electrically connected to the second cladding layer. The activating layer has a structure that the activating layer is two-dimensionally confined within the first cladding layer, the second cladding layer, and the current blocking layer, reflectivity of at least on end face of a resonator of the activating layer is less than, or equal to 5%, and loss in the resonator of the activating layer is higher than, or equal to 100 cm$^{-3}$.

24 Claims, 10 Drawing Sheets

SEMICONDUCTOR LASER WITH OPTIMUM RESONATOR

BACKGROUND OF THE INVENTION

1. Field of the Invention

The present invention relates to a highly reliable semiconductor laser with a low noise and low power consumption, and to an optical device with employment of such a semiconductor laser.

2. Description of the Related Art

Semiconductor lasers have been used as light sources for an optical disk recording/reproducing apparatus and the like. When light reflected from an optical disk is fed back to a semiconductor laser, this reflection light is optically coupled to a light resonator fabricated outside the semiconductor laser. Thus, the oscillation longitudinal mode of the semiconductor laser is varied under influences of the unstable resonator formed outside the laser, so that relative intensity noise (abbreviated as "RIN") of the laser light would be increased due to a so-called "mode hopping".

As the waveguide mechanisms of the conventionally utilized semiconductor lasers, there are a gain guide type waveguide and a refractive-index guide type waveguide. Referring to FIG. 1, an example of the gain guide type semiconductor laser will now be explained. In the semiconductor laser of FIG. 1, reference numeral 21 indicates a substrate made of n-type GaAs and the like, reference numeral 22 shows a cladding layer made of AlGaAs and so on, reference numeral 23 denotes an activating layer made of undoped AlGaAs and the like, and reference numeral 24 represents a cladding layer made of p-type AlGaAs and the like. Further, reference numeral 25 shows a capping layer made of p-type GaAs and the like, reference numeral 26 represents a high resistance region formed by way of ion implantation, and also reference numerals 27 and 28 are ohmic electrodes.

In this case, the oscillation longitudinal mode is a multimode oscillation as represented in FIG. 2. Coherence of the laser light is lowered due to this multimode oscillation, and coupling of the laser light with the external resonator becomes weak. Therefore, noise may be reduced. Since the threshold level of this gain guide type semiconductor laser is high, power consumption thereof is increased. The gain guide type semiconductor laser has such a drawback that since the cophasal surface of the laser light is curved astigmatism may occur, whereby the laser light cannot be focused onto an optical disk by employing a single spherical lens.

On the other hand, there is shown an example of the refractive-index guide type semiconductor laser in FIG. 3. In this refractive-index guide type semiconductor laser of FIG. 3, a cladding layer 22 made of n-type AlGaAs or the like, an activating layer 23 made of undoped AlGaAs or the like, and another cladding layer 24A made of p-type AlGaAs or the like are laminated on a semiconductor substrate 21 made of n-type GaAs or the like. Furthermore, a current stopping layer 29 made of n-type GaAs and the like is formed on this cladding layer 24A in a predetermined pattern. Subsequently, this current stopping layer 29 is covered on its whole surface with another cladding layer 24B made of a p-type AlGaAs or the like and another capping layer 25 of p-type GaAs or the like. Thus, both sides of the light emitting region are defined by the current stopping layer 29, thereby lowering the threshold level. In FIG. 3, reference numerals 27 and 28 indicate electrodes, respectively.

As described above, the refractive-index guide type semiconductor laser is featured such that the threshold level thereof becomes low, the low power consumption is realized, and astigmatism becomes small. The oscillation longitudinal mode of such a refractive-index guide type semiconductor laser corresponds to a single oscillation longitudinal mode as shown in FIG. 4. Consequently, this type of semiconductor laser has such a drawback that optical feedback induced (pumped) noise becomes large.

To reduce, or suppress the optical feedback induced noise of the above-described semiconductor laser, perfect optical isolation should be implemented. However, such a perfect optical isolation is practically difficult, and also very expensive optical components are necessarily required. As a consequence, the refractive-index guide type semiconductor laser per se must own such a characteristic that the semiconductor laser cannot be readily mode-pumped even under presence of returning light.

On the other hand, in a semiconductor laser where the activating layer as shown in either FIG. 1 or FIG. 3 is extended along the horizontal direction, if reflectivity of the facet thereof on the side of the light output port would be relatively lowered so as to satisfy the noise characteristic for such optical feedback, loss in the optical resonator would become large and threshold carrier density would be increased. As a result, deterioration of the activating layer would be rapidly emphasized and, thus, there is a risk that high reliability could not be achieved.

OBJECTS AND SUMMARY OF THE INVENTION

An object of the present invention is to provide a semiconductor laser operable under lower power consumption with high reliability by making an optical resonator structure optimum to reduce carrier density within an activating layer thereof lower than a preselected value.

Another object of the present invention is to provide a semiconductor laser in which a longitudinal multi-oscillation mode is prompted and the returning-light induced noise is reduced.

Another object of the present invention is to provide such a semiconductor laser that even when loss in the optical resonator of a semiconductor laser is relatively high value, e.g., higher than, or equal to 100 cm$^{-1}$, the thickness and width of the activating layer 4 and the length of the resonator are selected to be proper values in order that the threshold carrier density becomes lower than, or equal to $2.5 \times 10^{18}$ cm$^{-3}$. Accordingly, the semiconductor laser with long lifetime and high reliability can be obtained.

Another object of the present invention is to provide a semiconductor laser capable of emitting laser light at a higher efficiency along a forward direction, and also of reducing optical feedback pumped noise by making reflectivity of the facet 14B located opposite to the end face 14A on the side of light output port, equal to, or higher than that of the end face 14A.

Another object of the present invention is to provide an optical device capable of reducing optical feedback pumped noise of a semiconductor laser by taking account of an amount of the optical feedback.

A further object of the present invention is to provide an optical device capable of achieving a high ratio of signal to noise (S/N).

A still further object of the present invention is to provide an optical device capable of reducing returning-light pumped noise by in particular, reducing a volume "V" of an activating laser and by incorporating a semiconductor laser with an SDH type structure into an optical system whose light returning amount is 0.1 to 1%. Accordingly, the spontaneous emission coefficient $\beta$SP may be considerably increased and the multimode oscillation may be achieved at a high efficiency.

As a consequence, a semiconductor laser according to the present invention is characterized by comprising:
an activating layer;
first and second cladding layers for sandwiching said activating layer, the energy gaps of which are greater than that of said activating layer;
a current blocking layer provided in contact with both sides of said activating layer;
a first electrode electrically connected to said first cladding layer; and
a second electrode electrically connected to said second cladding layer, wherein
said activating layer has a structure that the activating layer is two-dimensionally enclosed within said first cladding layer, said second cladding layer, and said current blocking layer;
reflectivity of at least one end face of a resonator of said activating layer is less than, or equal to 5%; and
loss in the resonator of said activating layer is higher than, or equal to 100 cm$^{-3}$.

An optical device according to the present invention is characterized by comprising a semiconductor laser and an optical system. This semiconductor laser comprises:
an activating layer;
first and second cladding layers for sandwiching said activating layer, the energy gaps of which are greater than that of said activating layer;
a current blocking layer provided in contact with both sides of said activating layer;
a first electrode electrically connected to said first cladding layer; and
a second electrode electrically connected to said second cladding layer,
wherein the activating layer has a structure that the activating layer is two-dimensionally enclosed within said first cladding layer, said second cladding layer, and said current blocking layer; and
reflectivity of at least one end face of a resonator of said activating layer is less than, or equal to 5%.
In the optical system, an amount of optical feedback of the semiconductor laser facing the above-described one facet of the resonator is equal to 0.1 to 1%.

In accordance with the present invention, optical feedback induced noise of the semiconductor laser may be reduced by taking account of the amount of optical feedback, and furthermore the carrier density within the activating layer is set to be smaller than, or equal to a predetermined value by making the structure of this resonator optimum. Accordingly, such a semiconductor layer operable under low power consumption with high reliability may be manufactured at higher yield. Furthermore, it is possible to provide an optical device capable of high S/N with employment of this semiconductor laser.

As in case that a low reflectivity coating is made on the facets of the resonator, the semiconductor laser oscillated under such condition that the carrier density within the activating layer is increased, owns strong correlation between the threshold carrier density and the lifetime as represented in FIG. 5. As a result, it is apparent that the higher the carrier density becomes, the stronger the activating layer becomes deteriorated, resulting in disturbance of maintaining reliability.

In connection to this correlation, a noise characteristic with respect to the optical feedback of the semiconductor laser is shown in FIG. 6. As apparent from this noise characteristic the noise characteristic greatly depends upon reflectivity of the end faces of the resonator, namely, mirror loss. The reflectivity of the end faces has a reverse correlationship with respect to the carrier density as shown in FIG. 7. Therefore, there is a trade-off relationship between establishments of the reliability and the noise characteristic. In this case, the establishment of the noise characteristic is achieved by a synergetic effect among an increase of the spontaneous emission coefficient $\beta$SP, an increase of the carrier density, and a decrease of the light density within the resonator.

Among them, increase of the carrier density and decrease of the light density exclusively imply that the end face reflectivity is lowered and the mirror loss is increased. The spontaneous emission coefficient $\beta$SP corresponds to an amount determined depending upon the structure parameters of the semiconductor laser, namely, the stripe width, the thickness of activating layer, the length of resonator, or the light confinement factor defined by these parameters and the refractive index difference.

Here, consider as to, for instance, the thickness of the activating layer, relative noise strengths and behavior of lifetime when a certain parameter is changed. A solid line "A" of FIG. 8 represents that the thickness of the activating layer is thin, for example, in the order of 50 nm. The threshold carrier density with such a laser structure may be exclusively determined and only the lifetime corresponding thereto is achieved.

To the contrary, for instance, the thickness of the activating layer 4 is increased, say approximately 100 nm by changing the parameter. In this case, the light confinement factor is changed in the direction to be increased. As a result of this effect, both the increase of the spontaneous emission coefficient and the decrease of the threshold carrier density can be achieved at the same time. In this case, as shown by a solid line "B" of FIG. 8, it is possible to reduce the threshold carrier density while the relative noise intensity is sufficiently lowered. As a result, a long lifetime may be achieved.

As previously explained, according to the present invention, the relative-noise intensity of the semiconductor laser can be sufficiently lowered by properly selecting the thickness and width of the activating layer 4 and the length of the resonator in order that reflectivity of the end face 14A of this resonator on the side of light output portion is at least less than, or equal to 5%, loss in the resonator is greater than, or equal to 100 cm$^{-1}$, and also threshold carrier density is smaller than, or equal to $2.5 \times 10^{18}$ cm$^{-3}$. Accordingly, lifetime may be extended.

In particular, when the resonator is fabricated in either a so-called "taper type", or a so-termed "flare type" by gradually extending the width of the resonator at the end face portion thereof, or by forming the activating layer in a stripe shape, the width of the resonator from which laser light is mainly emitted, may be preferably made greater than 1 micrometer and smaller than 1.6 micrometers. As a consequence, as previously stated, a longer lifetime can be realized while a relative noise intensity is reduced.

Then, another description will now be made of an optical device constructed by employing the SDH (Separated Double Hetero) type semiconductor laser which has been proposed by, for instance, Japanese Patent Application No. 3-90816 by the same assignee as the present patent application. That is, this semiconductor laser is so fabricated that on the substrate 1 having the major surface being {100} crystal face, the stepped portion, i.e., either groove or ridge 2 extending along the direction of the <011> crystal axis is provided. At least, the first cladding layer 3, the activating layer 4, the second cladding layer 5, and the current blocking layers 6, 7, 8 are epitaxial-grown with entirely covering this ridge 2. Then, at least the activating layer 4 on the ridge 2 is mutually split from other components. The resultant SDH type semiconductor laser is employed to construct this optical device. Accordingly, the long life semiconductor laser with the low threshold value can be obtained under low relative noise intensity.

On the other hand, the above-described relationship between the relative noise intensity and the facet reflectivity depends upon the amount of light returned to the laser. In accordance with the present invention, as previously explained, the semiconductor laser whose reflectivity at the end face of the light output port is less than 5% is assembled into the optical system whose light amount returned to the laser is 0.1 to 1%, so that the optical feedback pumped noise can be considerably reduced. In other words, the loss in optical resonator, so-called "mirror loss" is rather increased by lowering the reflectivity of the end face of the light output port. As a consequence, it is expectable that the oscillation wavelength may be made in multimode. As will be explained in detail in the below-mentioned embodiment, when the amount of returning light exceeds 1%, the optical feedback pumped noise is adversely influenced by receiving this effect. Also, it is obvious that better influences cannot be obtained even when the amount returning light is below 0.1%. That is, it could be recognized from the results of great research made by the inventors and so on of this great invention that the film with low reflectivity must be employed, taking account of optical feedback amount for the optical system.

Furthermore, if a relationship between the volume "V" of the activating layer and the light confinement rate "Γ" is defined as follows:

$$\Gamma/V \geqq 1.5 \times 10^{15} m^{-3}$$

the optical feedback pumped noise could be firmly reduced. This may be achieved from the following various reasons.

A laser oscillation is performed by selectively amplifying spontaneous emission light, while the spontaneous emission light becomes a "seed". This spontaneous emission light is produced at random over a wide wavelength range. When the spontaneous emission coefficient βSP indicative of the magnitude of this spontaneous emission light would become large, laser oscillations with various wavelengths could occur. In other words, the laser may be easily oscillated in multimode. The spontaneous emission coefficient βSP is expressed by the below-mentioned equation:

$$\beta SP = \Gamma \lambda 4 K / (4\pi 2 n 3 V \delta \lambda)$$

where symbol "Γ" denotes confinement factor of light into an activating layer, symbol "V" shows a volume of the activating layer, symbol "λ" indicates a center wavelength, symbol "δλ" represents a wavelength spread in spontaneous emission light spectrum, symbol "n" is a refractive index of the activating layer, and symbol "K" shows a factor reflecting a complex effect of a lateral mode. It should be noted that this factor K is equal to 1 in case of the refractive-index guide type laser.

Therefore, if the light confinement factor Γ would be large and the volume V of the activating layer would be small, the spontaneous emission coefficient βSP would be, of course, great. As a result, the refractive-index guide type laser may be readily oscillated in the multimode. In addition, if the reflectivity of the resonator facet on the side of light output port is made less than 5%, the resultant mirror loss become large. Accordingly, both the carrier density and the gain spectrum are increased, and the oscillation mode resembles to the multimode longitudinal oscillation, resulting in the gain guide type laser.

As previously explained, since the laser wherein the reflectivity of the facet at the light output port is below 5% is incorporated into such an optical system that the amount of light returned from the optical disk or the like is selected to be higher than 0.1% and lower than 1% under specific condition that the ratio "Γ/V" of the light confinement factor for this activating layer to the volume thereof is set to be more than, or equal to $1.5 \times 10^{15}$ m$^{-3}$, the spontaneous emission efficiency βBp of the laser per se is selected to be higher than above $10^{-5}$, thereby emphasizing the multimode longitudinal oscillation, and reducing further the optical feedback pumped noise.

On the other hand, in order to set the spontaneous emission rate βBP to be higher than, or equal to $10^{-5}$, it is desirable to make the volume of the activating layer small. When the above-described SDH type semiconductor laser proposed by the same assignee as that of the present application is employed, the volume of the activating layer thereof becomes considerably small, resulting in the large spontaneous emission rate βSP. Therefore, the multimode oscillation can be performed at a higher efficiency and also the optical feedback pumped noise can be considerably lowered.

Moreover, since the reflectivity of the facet 14B located opposite to the facet 14A the side of the light output port is made equal to, or higher than the reflectivity of this facet 14A, the laser light can be emitted toward the front direction at higher efficiencies. Also, as previously explained, the optical feedback pumped noise can be reduced or suppressed.

BRIEF DESCRIPTION OF THE DRAWINGS

The above and other objects, features, and advantages of the present invention will become apparent from the following detailed descriptio of illustrative embodiments thereof to be read in conjunction with the accompanying drawings.

DESCRIPTION OF THE PREFERRED EMBODIMENTS

Figure 1:
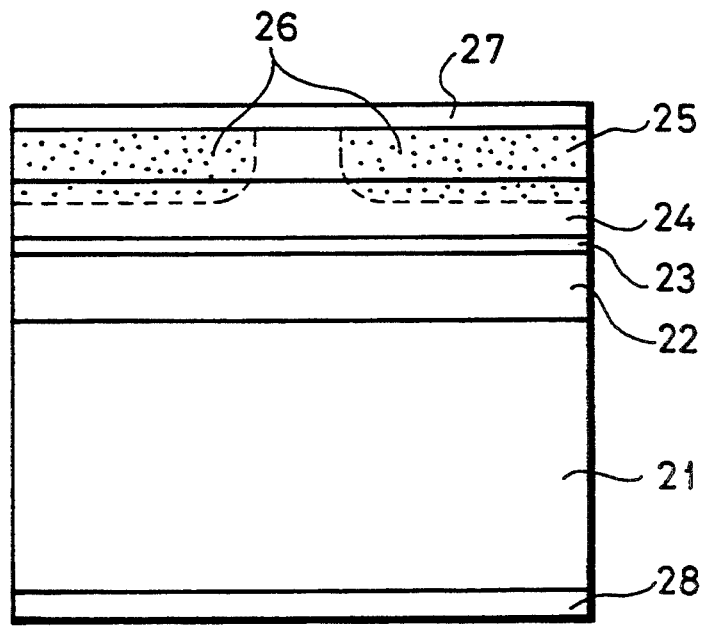
FIG. 1 schematically shows an enlarged sectional view of an example of the gain guide type semiconductor laser.
Figure 2:
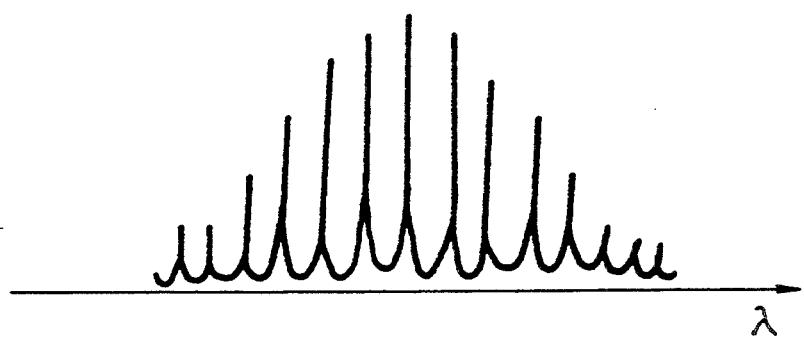
FIG. 2 represents a longitudinal mode spectrum characteristic of the gain guide type semiconductor laser shown in FIG. 1.
Figure 3:
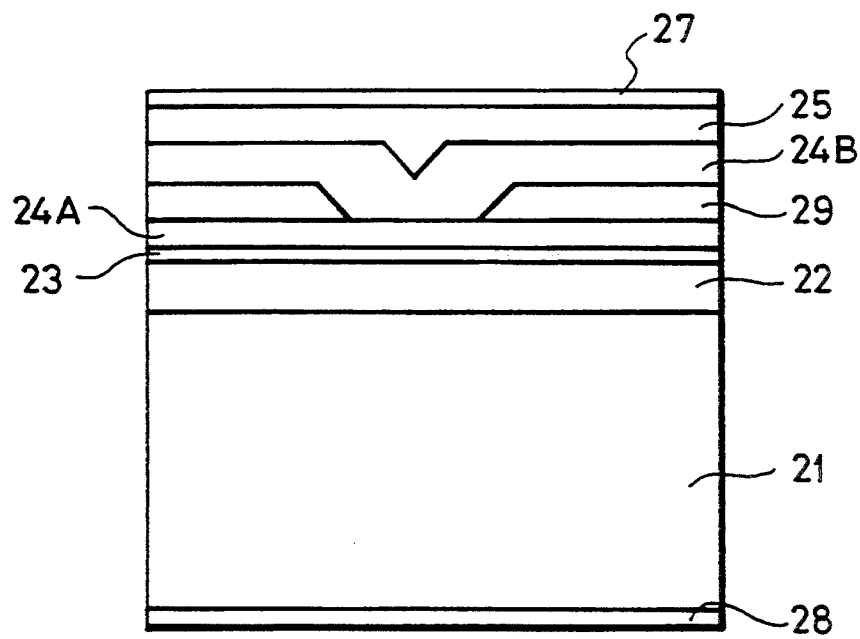
FIG. 3 schematically indicates an enlarged sectional view of an example of the refractive-index guide type semiconductor laser.
Figure 4:
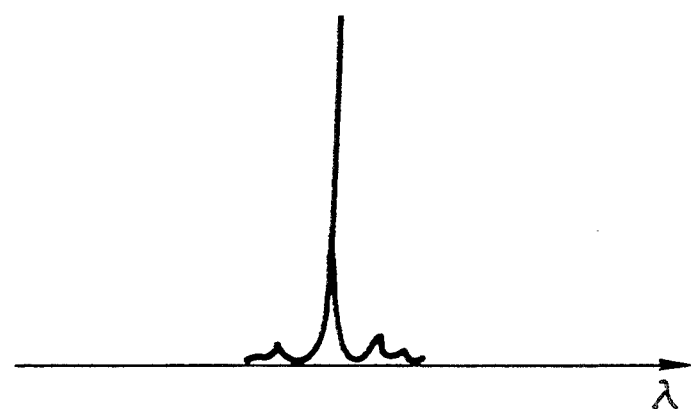
FIG. 4 shows a longitudinal mode spectrum characteristic of the refractive-index guide type semiconductor laser shown in FIG. 3.
Figure 5:
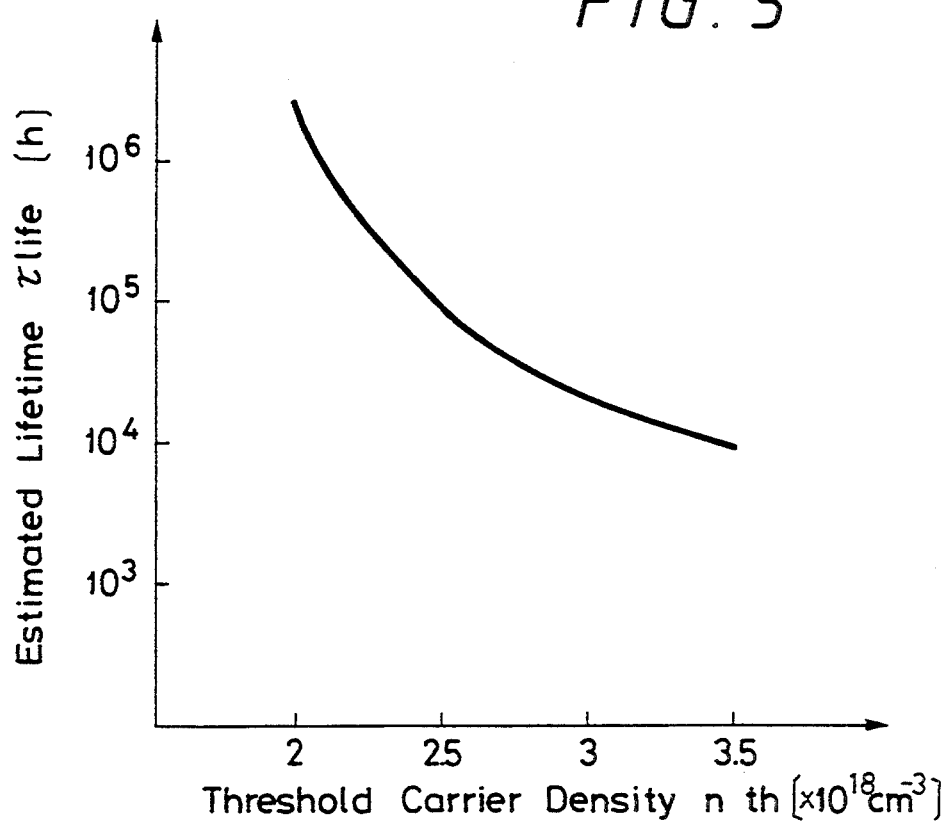
FIG. 5 graphically indicates a predicted lifetime depending on threshold carrier density.
Figure 6:
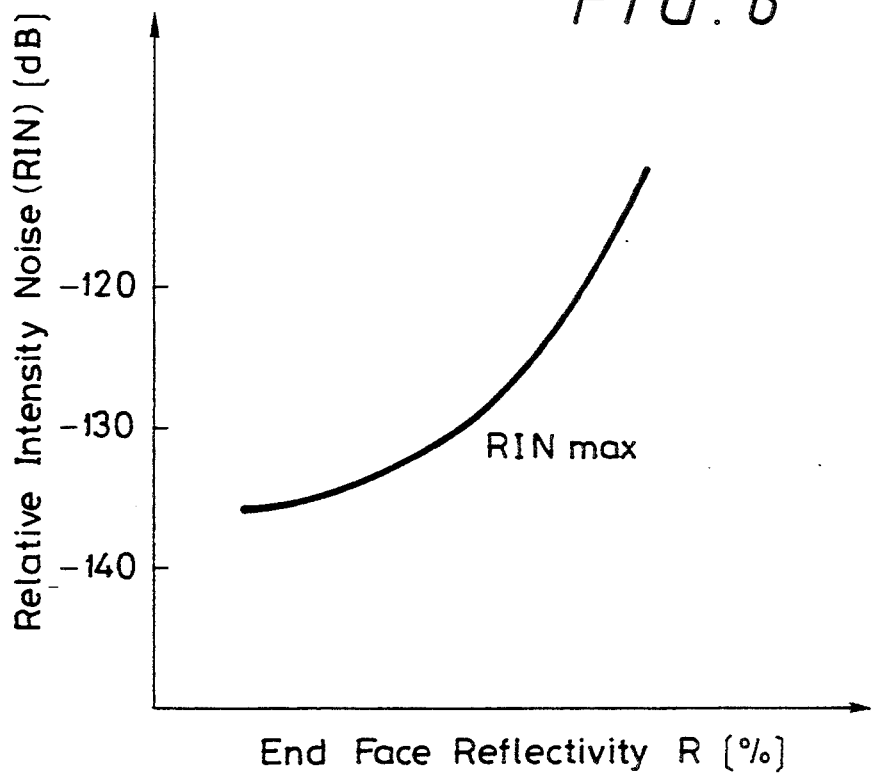
FIG. 6 graphically shows a relative noise intensity, depending on reflectivity of the light emission facet.
Figure 7:
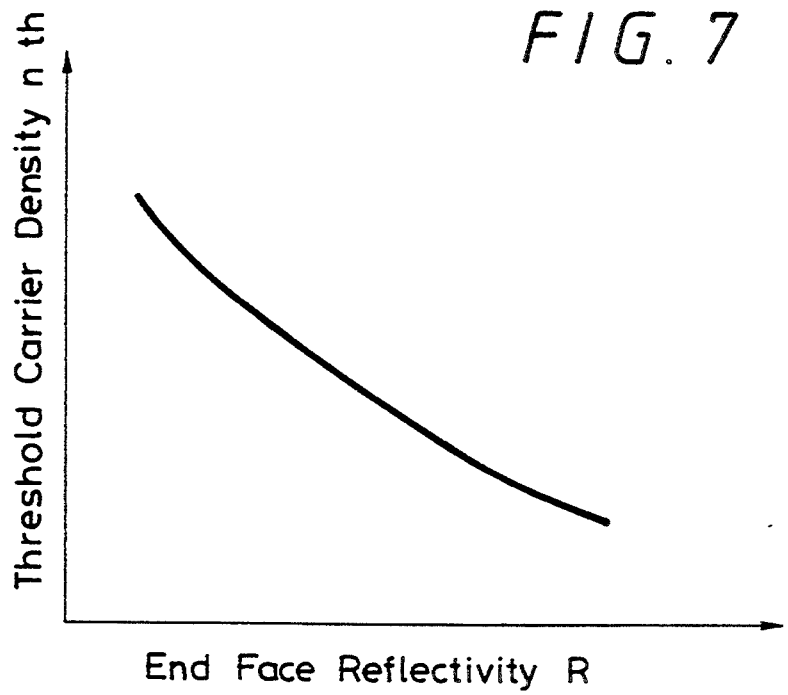
FIG. 7 graphically indicates threshold carrier density, depending on reflectivity of the light emission end face.
Figure 8:
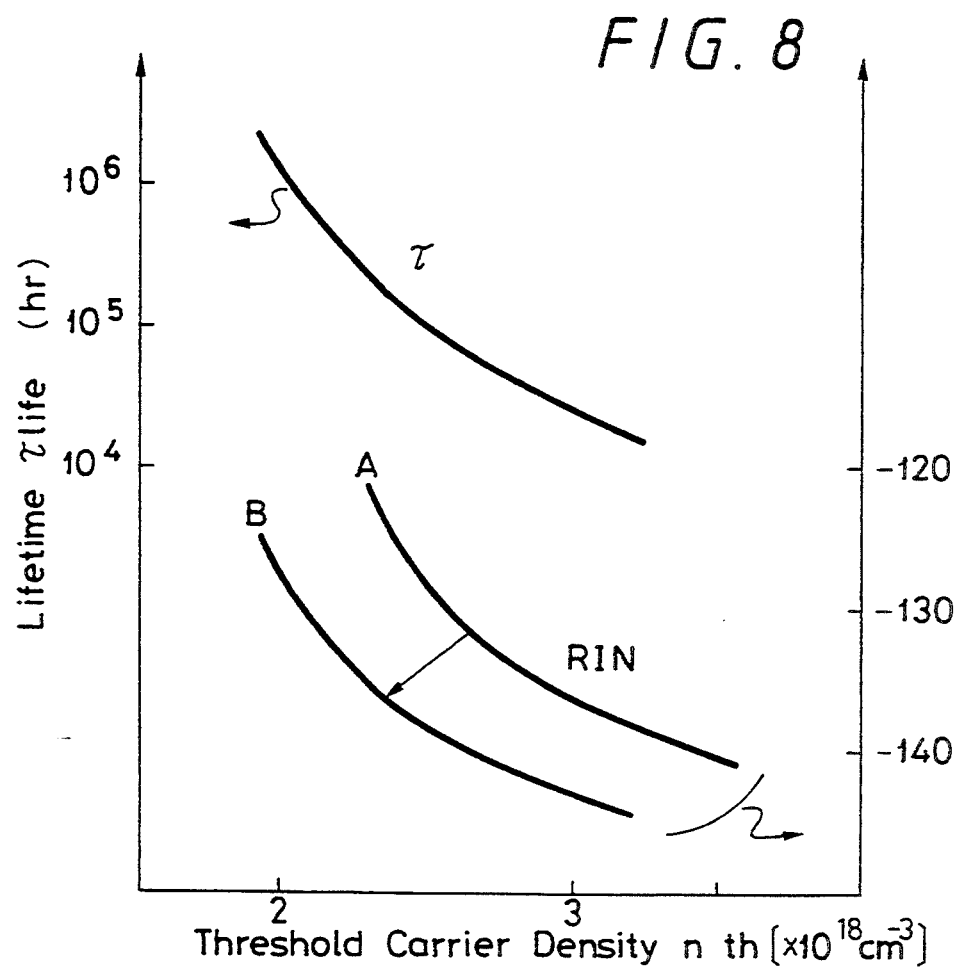
FIG. 8 graphically represents both a lifetime and a relative noise intensity, depending on threshold carrier density.

Referring now to the drawings, currently preferred embodiments of a semiconductor laser and an optical device with employment of such a semiconductor laser, according to the present invention, will be explained. In the embodiments, the present invention is applied to the above-explained SDH type semiconductor laser. Furthermore, there is shown an optical device arranged by using this SDH type semiconductor laser.

Figure 9:
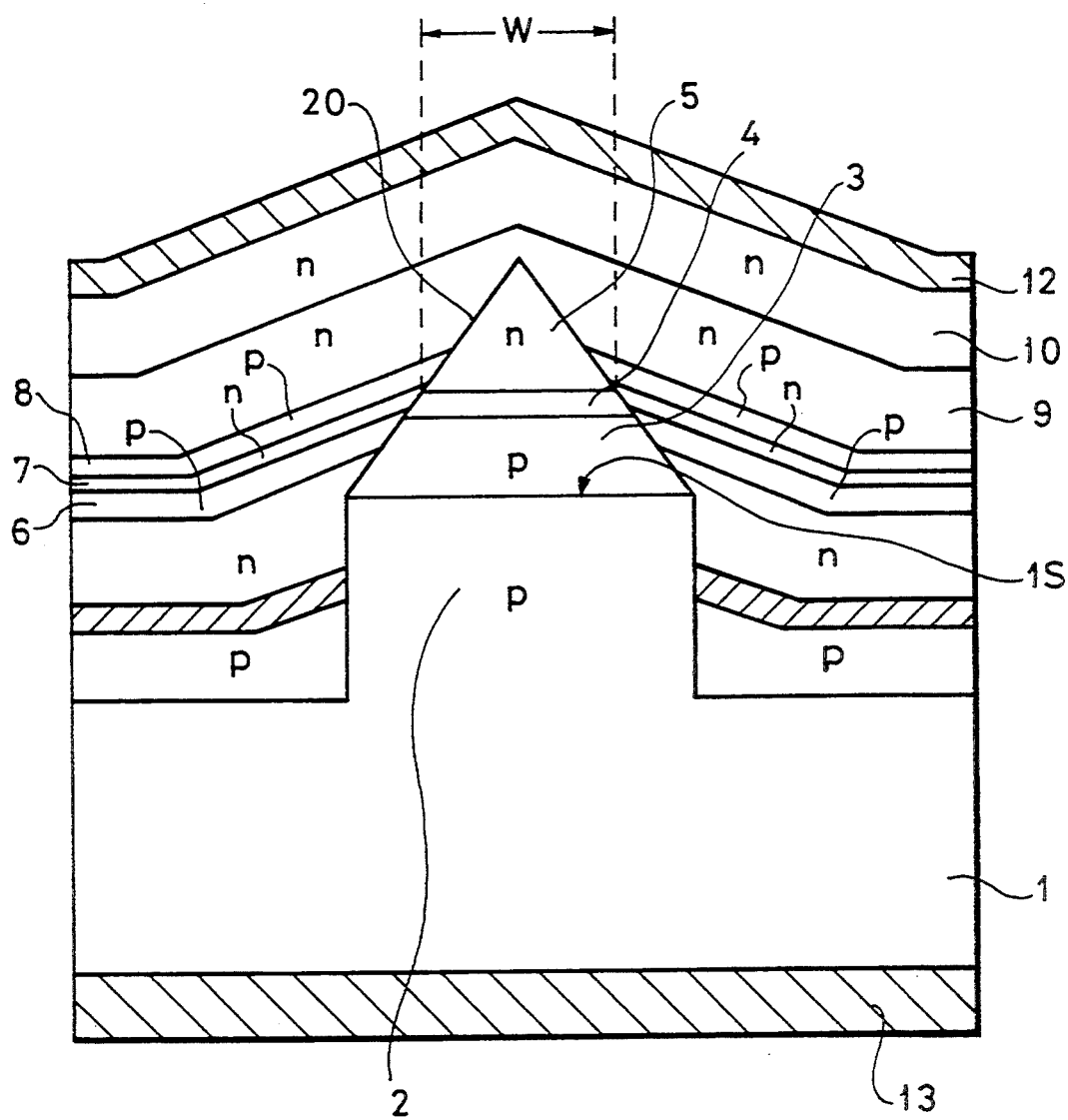
FIG. 9 schematically shows an enlarged sectional view of a main portion of an embodiment of a semiconductor laser according to the present invention.

FIG. 9 schematically shows an enlarged sectional view of this SDH type semiconductor laser. In FIG. 9, a substrate 1 has a plane 1S made of, for instance, a (100) crystal plane of a crystal plane {100} made of a first conductivity type compound semiconductor such as p-type GaAs or the like. On this plane 1S, for instance, a stripe-shaped stepped portion, e.g., a ridge 2 which extends along, for example, a [011] crystal axis direction of a <011> crystal axis direction, is formed way of wet etching process and the like. A width "W" of the ridge 2 is, for example, 3 micrometers and a depth thereof is 2 micrometers. It should be noted in FIG. 9 that the [011] crystal axis direction is indicated as a direction perpendicular to a plane of this paper sheet.

In case that the shape of the ridge 2 is selected to be either flare, or taper, a width of a portion thereof from which laser is dominantly emitted, is selected to be about 3 micrometers. The portion for dominant laser emission corresponds to, for example, a center of a resonator.

Then, for example, a first conductivity type cladding layer 3 made of p-type $Al^{0.45}Ga^{0.55}As$ or the like, a first conductivity type current blocking layer 6 made of p-type $Al^{0.45}Ga^{0.55}As$ or the like, and a second conductivity type current blocking layer 7 made of $Al^{10.45}Ga^{0.55}As$ or the like are successively epitaxial-grown while entirely covering the ridge 2. In addition, a first conductivity type current blocking layer 8 made of p-type $Al^{10.45}Ga^{0.55}As$ or the like a second conductivity type second cladding layer 9 made of n-type $Al^{10.45}Ga^{0.55}As$ or the like, and a capping layer 10 made of n-type GaAs or the like are formed by way of epitaxial growth. The thicknesses of the first conductivity type cladding layer 3, the activating layer 4, the second conductivity type first cladding layer 5, the current blocking layer 6, the second conductivity type current blocking layer 7, the first conductivity type current blocking layer 8, the second conductivity type second cladding layer 9, and the capping layer 10 are selected to be, for instance, 1.2 micrometers, 0.1 micrometer 1 micrometer, 0.2 micrometers, 0.1 micrometer, 0.2 micrometers, 1 micrometer and 3 micrometers, respectively.

Then, electrodes 12 and 13 are formed on the upper surface of this capping layer 10 and the rear surface of the substrate 1 under ohmic conditions by way of evaporation and sputtering processes or the like, respectively.

When the epitaxial growth is carried out by using a methyl system material such as trimethyl aluminum and trimethyl gallium or the like by way of MOCVD (metal organic chemical vapor deposition), once {111} B crystal plane is produced from the side portion of the ridge 2 extending along the [001] crystal axis direction, it is difficult that the epitaxial growth is produced on this {111} B crystal plane. As a result, both side planes of the respective layers 3, 4, 5 on the ridge 2 are grown in a triangle shape in such a manner that these side planes are fabricated by {111} B crystal plane which is inclined on the major surface of the substrate 1 at approximately 54.7°, so that a region 20 having a triangle section is constructed. Accordingly, the region 20 having a triangle section is formed in such a way that in particular, the activating layer 4 formed on the ridge 2 are separated from the epitaxial layers grown in both side grooves.

Thus, the first and second conductivity type current blocking layers 6, 7, 8 are separated at both sides of the activating layer 4 formed on this ridge 2, and are successively laminated. As a result, a current may effectively flow through only the activating layer 4 of the region 20 having a triangle section. The light may be confined also with respect to the lateral direction of the activating layer 4 by selecting the band gaps of the current blocking layers 6, 7, 8 to be large than that of the activating layer 4. As a consequence, the lower threshold value and the lower operating current can be achieved.

This SDH type semiconductor laser is made in an embedding structure since the activating layer 4 is sandwiched by the current blocking layers 6, 7, 8 having low refractive index. Therefore, this SDH type semiconductor laser becomes the refractive index guide type semiconductor laser and is superior to others in the lateral mode control.

As already described, in this case, the width of the ridge 2 is selected to be about 13 micrometers, and the thicknesses of the respective layers are selected to the above-described values, so that the width of the activating layer 4 becomes about 1.4 microns.

Figure 10:
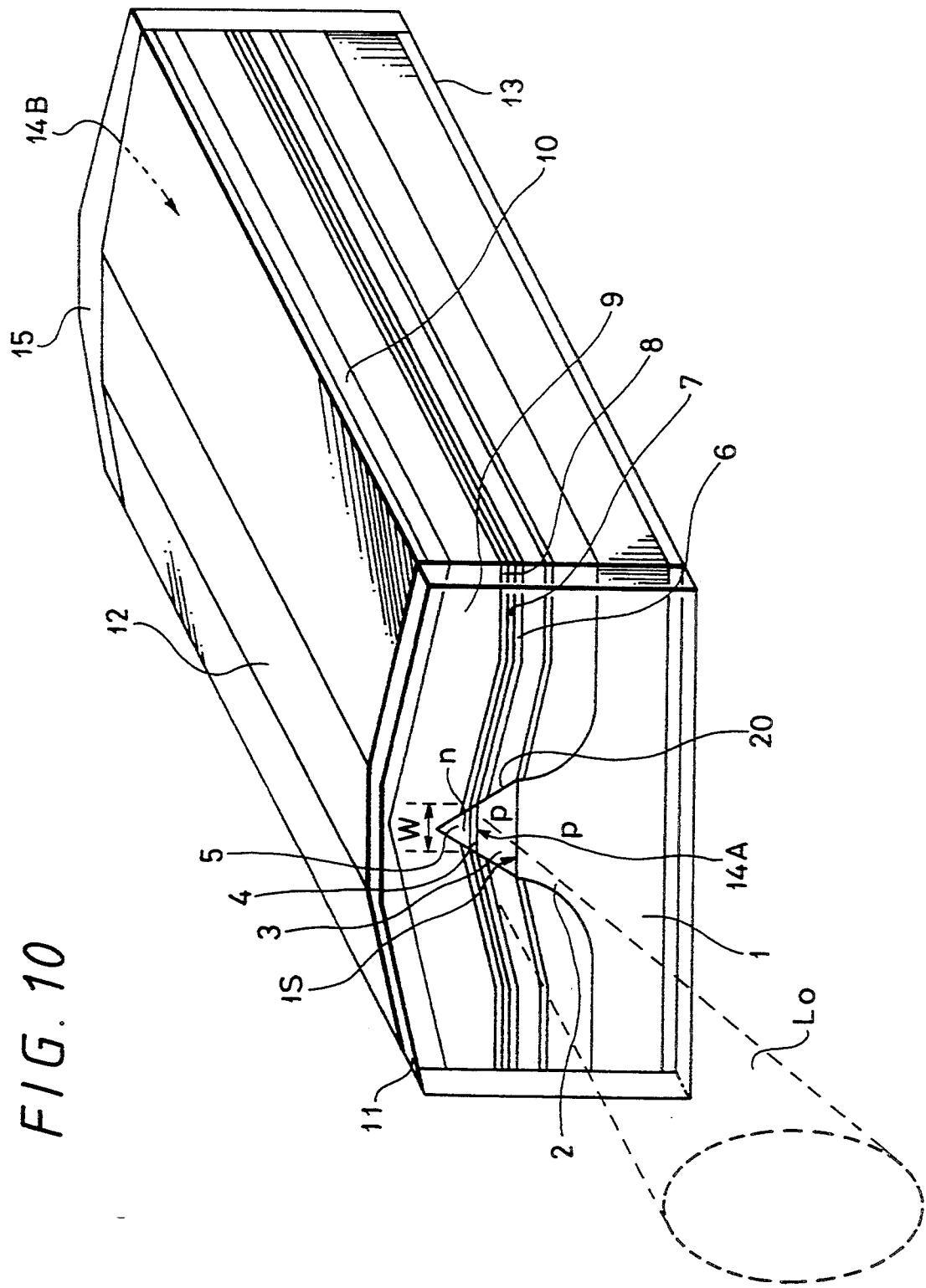
FIG. 10 schematically represents an enlarged perspective view of another embodiment of the semiconductor laser according to the present invention.

Thereafter, as illustrated in FIG. 10, this resulting semiconductor laser is cloven in order that the length of the resonator becomes, for instance 200 micrometers. A low reflective film 11 made of amorphous silicon SiO₂, SiNx, e.g., Al₂O₃ and having reflectivity of 1%, for instance, is formed on the facet 14A on the side of laser output (emission) portion. Similarly, in this case, another low reflective film having reflectivity of 10% is formed on the facet 14B at the rear side. The thicknesses of the facet 14A on the side of laser output port and of the face 14B on the rear side are controlled by way of the sputtering and electron beam evaporation processes or the like, respectively, thereby coating the reflective film thereon while controlling the thickness of this low reflective film.

At this time, resonator loss "α" is defined as follows:

$$\alpha = (1/2L) \cdot \ln[1/(Rf \cdot Rr)]$$
$$= 170 \, [\text{cm}^{-1}]$$

Even if the resonator loss becomes higher than, or equal to 100 cm⁻¹ the carrier density under oscillation can be controlled by selecting the width of the activating layer 4 to be the above-described proper value. As a consequence, deterioration of the activating layer 4 can be suppressed. In the above example, a mean time to failure (MTTF) under continuous CW(DC) operation with 70° C. and 5 mW becomes approximately 2,500 hours, and reliability of this semiconductor laser could be maintained.

Next, a description will now be made of such a case that this type of semiconductor laser is incorporated in an optical device and the measurement is carried out for this optical device under operation.

As previously explained, when the semiconductor laser is manufactured as the SDH type structure, the width "W" of the activating layer 4 is controlled by way of the width of the ridge 2 and the thickness of the first conductivity type cladding layer 3 thereon, so that this width "W" may be easily made narrow, e.g., on the order of 1.1 to 1.6 micrometers. As a consequence, the volume "V" of this activating layer 4 may be made small, whereby the spontaneous emission coefficient βSP can be increased.

In this case, assuming now that the width "W" of the activating layer 4 is selected to be, for instance 1.4 micrometers from the range between 1.1 and 1.6 micrometers; the thickness of the activating layer 4 is 0.1 micrometer; the length of the resonator is 200 micrometers; a wavelength spread δλ of oscillating light is 30 manometers; and the wavelength "λ" is 0.78 micrometers, the spontaneous emission coefficient βSP becomes about 10⁻⁴, resulting in emphasizing of the multiple longitudinal oscillation mode.

As previously stated, the low reflective film 11 made of SiO₂, SiNx, Al₂O₃ and a-Si or the like having reflectivity, for instance, lower than 5% was coated on the end face 14A at the laser light output port by utilizing the sputtering process, or the electron beam evaporation process and so on. Similarly, another reflective film 15 having reflectivity equal to, or higher than that of the reflective film 11 was formed on the facet 14B positioned behind the facet 14A.

Figure 11:
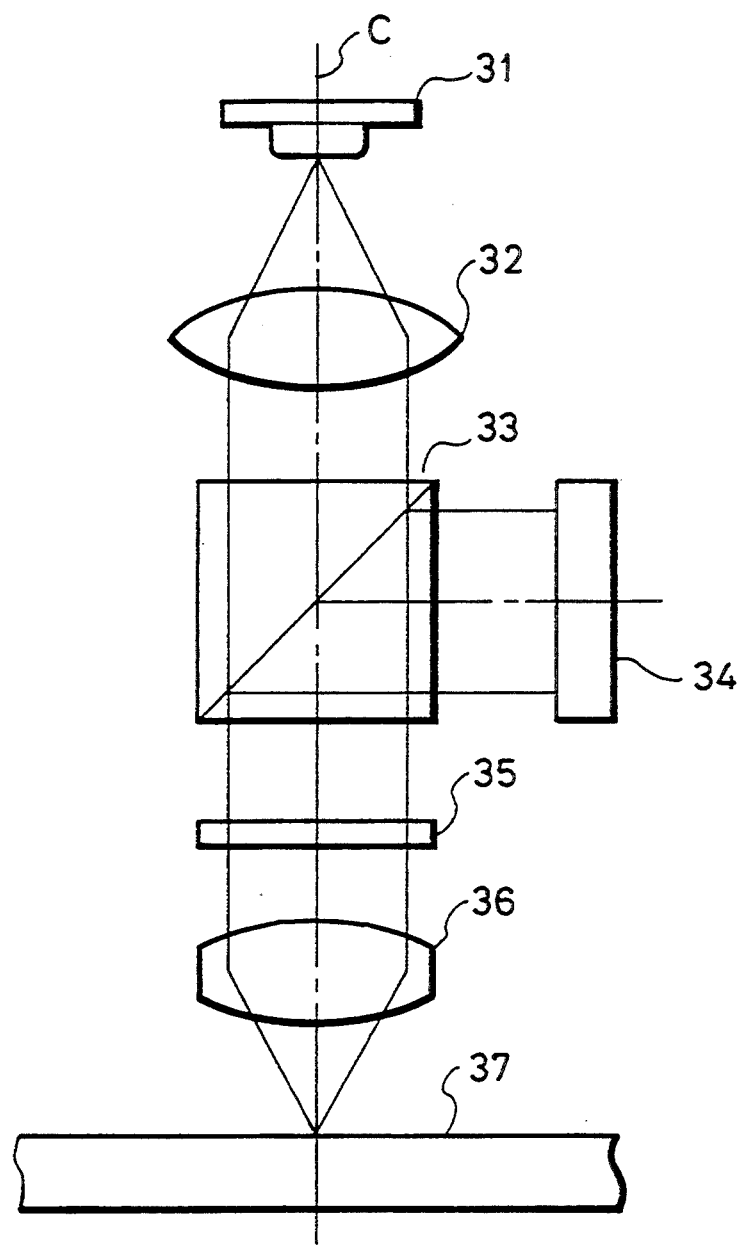
FIG. 11 is a schematic diagram of showing an embodiment of an optical device according to the present invention.

Then, this laser had been incorporated into an optical device including such an optical system as shown in FIG. 11, and a relative noise intensity thereof was measured while the amount of returning light was varied. Light emitted from a laser 31 is irradiated via a collimator lens 32, a polarizing beam splitter 33, a ¼λ plate 35, and an objective lens 36 onto an object to be irradiated, in this case, a disk 37 such as an optical recording medium, a magneto-optical recording medium or the like. Then, most of light reflected from this recording medium is reflected via the objective lens 36 and the ¼λ plate 35 by the polarizing beam splitter 33, and is detected by a detector 34, so that the recorded signals are read out therefrom, for instance.

With this arrangement, the amount of laser light returned to the semiconductor laser 31 may be modulated from approximately 0.001% up to 100% by adjusting the arrangement of the polarizing beam splitter 33 and the λ/4 plate 35 and the interval between them.

Figure 12:
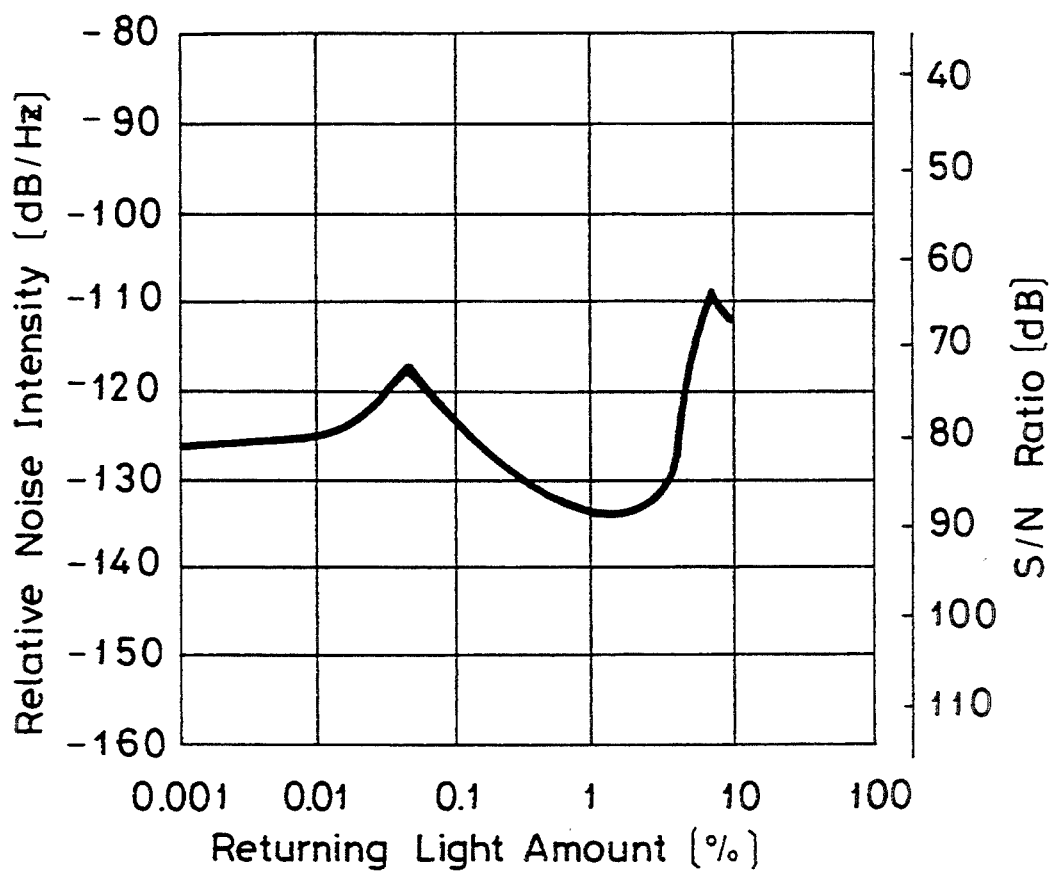
FIG. 12 graphically shows a relationship of a relative noise intensity with regard to an amount of returning light in the embodiment of the semiconductor laser according to the present invention.
Figure 13:
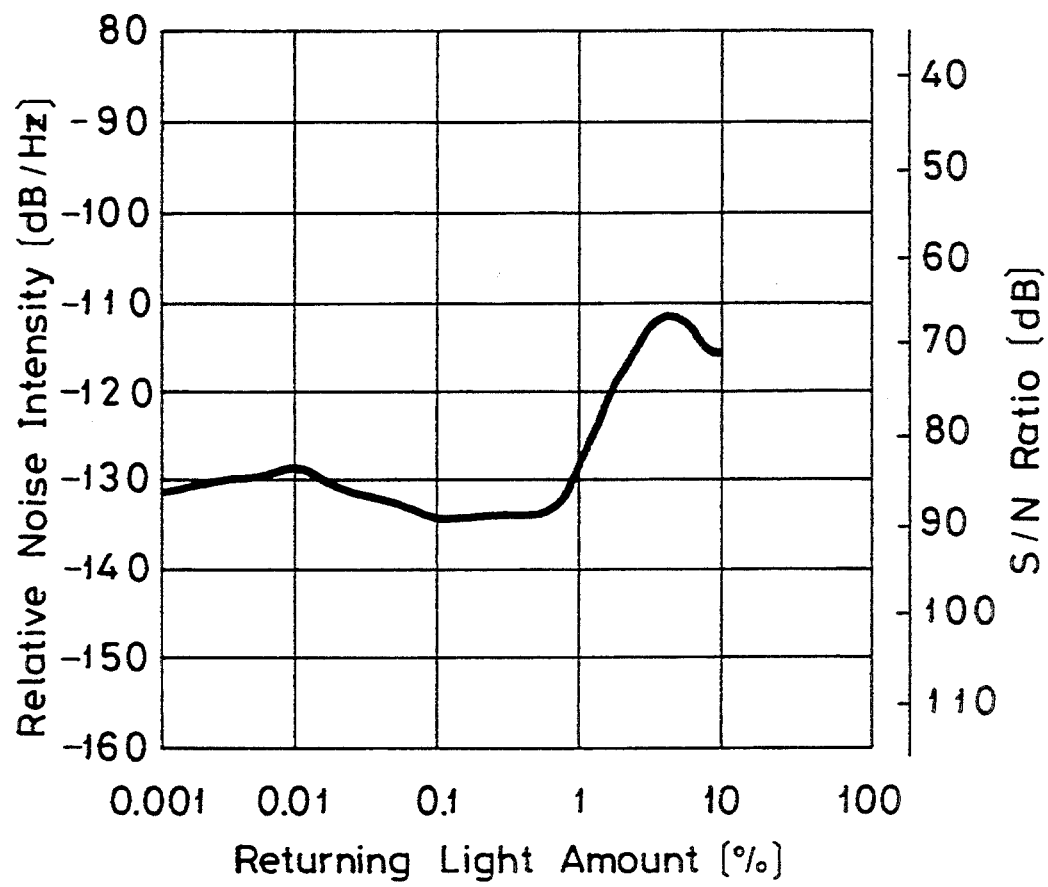
FIG. 13 graphically indicates a relationship of another relative noise intensity with respect to an amount of returning light in the embodiment of the semiconductor laser according to the present invention.
Figure 14:
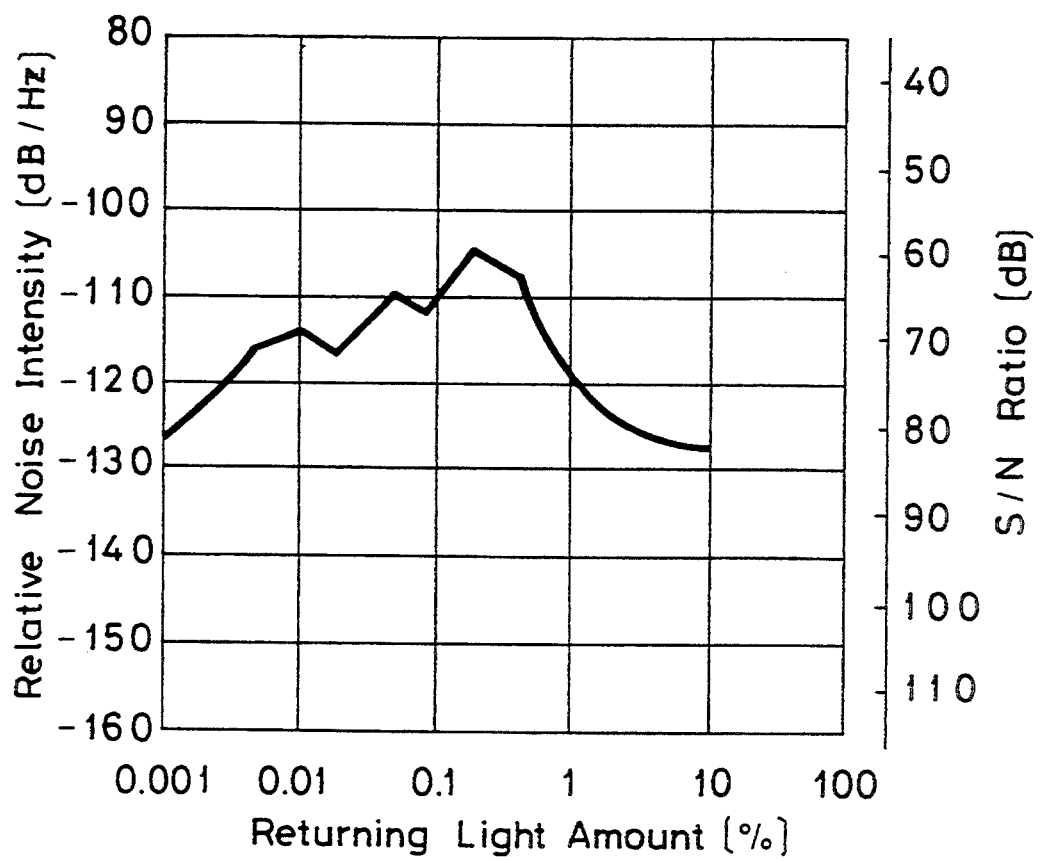
FIG. 14 graphically denotes a relationship of a relative noise intensity with respect to an amount of returning light in the comparison example.

In FIGS. 12 and 13, there are represented relative noise intensity "RIN" of the semiconductor laser with the SDH type structure, on which the above-described low reflective film 11 is provided. Also, these drawings represent measurement results made by the optical device shown in FIG. 11 by varying the optical feedback amount. The example shown in FIG. 12 has been constructed under such conditions that the reflectivity of the front-sided low reflective film 11 is selected to be 5%, whereas the reflectivity of the rear-sided reflective film 15 is selected to be 20%. The example indicated in FIG. 13 has been constructed under such conditions that the reflectivity of the low reflective film 11 is selected to be 1%, whereas the reflectivity of the rear-sided reflective film 15 is selected to be 5%. In FIG. 14, there is shown as a comparison example wherein neither the low reflective film 11, nor the reflective film 15 is employed.

It is apparent from this result that the relative noise intensity with respect to the optical feedback amount is greatly changed by varying the reflectivity. In other words, in order to reduce the relative noise intensity, the reflectivity of the laser light emission facet is required to be proper values, taking account of the optical feedback amount.

Under such circumstance, the low relative noise intensity less than approximately-120 dB/Hz may be realized by selecting at least the reflectivity of the light emission facet to be less than 5% in such an optical system whose optical feedback amount is 0.1 to 1%. As a consequence, in accordance with the present invention, the reflectivity of the low reflective film 11 should be limited to 5% or less.

As previously explained, the low reflective film layer having the reflectivity of 5% or less is provided with the SDH type semiconductor laser having a relatively small volume "V" of the activating layer and the like, and the resulting semiconductor laser is incorporated into the optical system whose optical feedback amount is selected to be on the order of 0.1 to 1% so that this laser is oscillated in the multiple longitudinal oscillation mode. Since the spectrum of the laser light is widened and the coherent characteristic thereof is reduced due to this multiple longitudinal oscillation mode, substantially no adverse influence is given even when the laser light is returned to the semiconductor laser. The semiconductor laser can be oscillated in a stable condition under low power consumption without any astigmatism. Therefore, such a semiconductor laser is suitable to be used as a light source for an optical disk, an optical communication fiber and so on.

In the foregoing specification, the invention has been described with reference to specific exemplary embodiments thereof. It will, however, be evident that various modifications and change may be made thereto without departing from the broader spirit and scope of the invention as set forth in the appended claims. For instance, the materials and structures of the laser as well as the component arrangements of the optical device may be widely varied.

What is claimed is:

1. A semiconductor laser comprising:
   an activating layer;
   first and second cladding layers for sandwiching said activating layer, the energy gaps of which are greater than that of said activating layer;
   a current blocking layer provided in contact with both sides of said activating layer;
   a first electrode electrically connected to said first cladding layer; and
   a second electrode electrically connected to said second cladding layer, wherein
   said activating layer has a structure that the activating layer is two-dimensionally confined within said first cladding layer, said second cladding layer, and said current blocking layer;
   reflectivity of at least one facet of a resonator of said activating layer is less than, or equal to 5%; and
   loss in the resonator of said activating layer is higher than, or equal to 100 cm$^{-3}$.

2. A semiconductor laser as claimed in claim 1, wherein a width of the resonator of said activating layer is 1.1 to 1.6 micrometers.

3. A semiconductor laser as claimed in claim 2, wherein said activating layer, said first cladding layer, and said second cladding layer are formed on a stepped portion extending on a {100} crystal plane; and
   said activating layer, said first cladding layer, and said second cladding layer are fabricated as a triangle shape in cross-section.

4. A semiconductor laser as claimed in claim 1, wherein assuming now a volume of said activating layer is "V", and a confinement factor of light into said activating layer is "Γ", it is defined as follows:

$$\Gamma/V \geqq 1.5 \times 10^{15} m^{-3}$$

5. A semiconductor laser as claimed in claim 4, wherein said activating layer, said first cladding layer, and said second cladding layer are formed on a stepped portion extending on a {100} crystal plane; and
   said activating layer, said first cladding layer, and said second cladding layer are fabricated as a triangle in cross-section.

6. A semiconductor laser as claimed in claim 1, wherein said activating layer, said first cladding layer, and said second cladding layer are formed on a stepped portion extending on a {100} crystal plane; and
   said activating layer, said first cladding layer, and said second cladding layer are fabricated as a triangle in cross-section.

7. A semiconductor laser as claimed in claim 6, wherein assuming now a volume of said activating layer is "V", and a confinement factor of light into said activating layer is "Γ", it is defined as follows:

$$\Gamma/V \geqq 1.5 \times 10^{15} m^{-3}$$

8. A semiconductor laser as claimed in claim 6, wherein a width of the resonator of said activating layer is 1.1 to 1.6 micrometers.

9. A semiconductor laser as claimed in claim 1, wherein reflectivity of both end faces of the resonator of said activating layer is lower than, or equal to 5%.

10. A semiconductor laser as claimed in claim 9, wherein said activating layer, said first cladding layer, and said second cladding layer are formed on a stepped portion extending on a {100} crystal plane; and
    said activating layer, said first cladding layer, and said second cladding layer are fabricated as a triangle in cross-section.

11. A semiconductor laser as claimed in claim 1, wherein said semiconductor laser has a volume of such an activating layer whose threshold carrier density is lower than, or equal to $2.5 \times 10^{18}$ cm$^{-3}$.

12. An optical device comprising:
    a semiconductor laser; and
    an optical system positioned facing to one end face of a resonator of said semiconductor laser,
    said semiconductor laser including:
    an activating layer;
    first and second cladding layers for sandwiching said activating layer, the energy gaps of which are greater than that of said activating layer;
    a current blocking layer provided in contact with both sides of said activating layer;
    a first electrode electrically connected to said first cladding layer; and
    a second electrode electrically connected to said second cladding layer, wherein
    said activating layer has a structure that the activating layer is two-dimensionally confined within said first cladding layer, said second cladding layer, and said current blocking layer;
    reflectivity of at least one end face of a resonator of said activating layer is less than, or equal to 5%; and
    an amount of light returned to said semiconductor laser is lower than, or equal to 0.1 to 1%.

13. An optical device as claimed in claim 12, wherein loss in the resonator of said activating layer of said semiconductor laser is higher than, or equal to 100 cm$^{-3}$.

14. An optical device as claimed in claim 13, wherein assuming now that a volume of said activating layer is "V", and a confinement rate of light into said activating layer is "Γ", it is defined as follows:

$$\Gamma/V \geqq 1.5 \times 10^{15} m^{-3}$$

15. An optical device as claimed in claim 14, wherein said activating layer, said first cladding layer and said second cladding layer are formed on a stepped portion extending on a {100} crystal plane; and
    said activating layer, said first cladding layer, and said second cladding layer are fabricated as a triangle in cross-section.

16. An optical device as claimed in claim 13, wherein a width of the resonator of said activating layer is 1.1 to 1.6 micrometers.

17. An optical device as claimed in claim 16, wherein said activating layer, said first cladding layer, and said second cladding layer are formed on a stepped portion extending on a {100} crystal plane; and said activating layer, said first cladding layer, and said second cladding layer are fabricated as a triangle in cross-section.

18. An optical device as claimed in claim 12, wherein said activating layer, said first cladding layer, and said second cladding layer are formed on a stepped portion extending on a {100} crystal plane; and said activating layer said first cladding layer, and said second cladding layer are fabricated as a triangle in cross-section.

19. An optical device as claimed in claim 18, wherein assuming now that a volume of said activating layer is "V", and a confinement rate of light into said activating layer is "Γ", it is defined as follows:

$$\Gamma/V \geqq 1.5 \times 10^{15} m^{-3}$$

20. An optical device as claimed in claim 18, wherein a width of the resonator of said activating layer is 1.1 to 1.6 micrometers.

21. An optical device as claimed in claim 12, wherein reflectivity of both end faces of the resonator of said activating layer is lower than, or equal to 5%.

22. An optical device as claimed in claim 21, wherein the reflectivity of said one end face of the resonator facing said optical system is smaller than that of the other end face of the resonator.

23. An optical device as claimed in claim 21, wherein said activating layer, said first cladding layer, and said second cladding layer are formed on a stepped portion extending on a {100} crystal plane; and said activating layer, said first cladding layer, and said second cladding layer are fabricated as a triangle in cross-section.

24. An optical device as claimed in claim 12, wherein said optical device employs a semiconductor laser having a volume of such an activating layer whose threshold carrier density is lower than, or equal to $2.5 \times 10^{18}$ cm$^{-3}$.

* * * * *